(12) United States Patent
Jones et al.

(10) Patent No.: US 7,183,843 B1
(45) Date of Patent: Feb. 27, 2007

(54) ELECTRONICALLY TUNED POWER AMPLIFIER

(75) Inventors: David E. Jones, Cedar Rapids, IA (US); Joseph A. Kolosick, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 137 days.

(21) Appl. No.: 11/167,639

(22) Filed: Jun. 27, 2005

(51) Int. Cl.
*H03F 3/68* (2006.01)

(52) U.S. Cl. .................. 330/124 R; 330/53; 330/286
(58) Field of Classification Search ........... 330/124 R, 330/53, 286
See application file for complete search history.

(56) References Cited

U.S. PATENT DOCUMENTS

| 4,725,842 A * | 2/1988 | Mayberry ................ 342/198 |
| 6,115,593 A * | 9/2000 | Alinikula et al. ........... 455/324 |
| 6,326,841 B1 * | 12/2001 | Laureanti .................... 330/53 |
| 6,806,768 B2 * | 10/2004 | Klaren et al. ........... 330/124 R |
| 7,068,104 B2 * | 6/2006 | Burns et al. ................ 330/253 |

* cited by examiner

Primary Examiner—Patricia Nguyen
(74) Attorney, Agent, or Firm—Nathan O. Jensen; Kyle Eppele

(57) ABSTRACT

A power amplifier apparatus that includes a main power amplifier circuit and an injection power amplifier circuit is provided. The main amplifier includes a pair of quadrature coupled amplifiers. Similarly, the injection power amplifier also includes pair of quadrature coupled amplifiers. The output signal from the injection amplifier is connected to the isolation port of the quadrature coupler of the main amplifier. The input signal is split and applied to the inputs of both the main and injection amplifiers. The gain and phase through the injection amplifier is adjusted in order to vary the magnitude and phase of the signal injected into the isolation port of the quadrature combiner of the main amplifier. By varying the magnitude and phase of the injected signal, the impedance seen by the individual amplifiers within main amplifier can be controlled. Controlling these impedances allows the properties of the main amplifier to be dynamically varied.

20 Claims, 4 Drawing Sheets

ELECTRONICALLY TUNED POWER AMPLIFIER

BACKGROUND OF THE INVENTION

The present invention relates generally to power amplifiers and, more particularly, to electronically tuned power amplifiers.

Power amplifiers boost a low-power signal to a higher power level, to be delivered to a load. The load determines the gain, linearity, and efficiency of the amplifier. Having the ability to dynamically vary this load impedance allows the properties of the amplifier to be dynamically varied.

Current techniques for tuning power amplifiers include mechanical tuning, tuning using electrically variable capacitors or inductors, and injecting a carrier signal using a circulator. Mechanical tuning is employed in "cavity" amplifiers, which include mechanical cavity tuning controls. Here tuning is carried out by mechanically adjusting a cavity dimension. Mechanical tuning is usually slow and cumbersome.

The above-noted electrical tuning techniques (variable capacitors or inductors and injecting a carrier signal using a circulator), in general, allow for more rapid amplifier tuning than the mechanical adjustment method. However, these methods are typically suitable only for narrow band applications. Circulators, for example, have relatively narrow bandwidths and are therefore unsuitable for tuning in broad band applications.

Thus, there is a need for a power amplifier that includes a tuning system that is suitable for broadband applications.

SUMMARY OF THE INVENTION

A power amplifier apparatus that includes a main power amplifier circuit and an injection power amplifier circuit is provided. The main amplifier includes a pair of quadrature coupled amplifiers. Similarly, the injection power amplifier also includes a pair of quadrature coupled amplifiers. The output signal from the injection amplifier is connected to the isolation port of the quadrature coupler (or quadrature combiner) of the main amplifier. The input signal is split and applied to the inputs of both the main and injection amplifiers. The gain and phase through the injection amplifier is adjustable in order to vary the magnitude and phase of the signal injected into the isolation port of the quadrature combiner of the main amplifier. By varying the magnitude and phase of the injected signal, the impedance seen by the individual amplifiers within main amplifier can be controlled. Controlling these impedances allows the properties of the main amplifier to be dynamically varied.

DETAILED DESCRIPTION OF THE PREFERRED EMBODIMENTS

The present invention relates, in general, to electronically tuned power amplifiers. More specifically, the present invention relates to power amplifier systems that employ quadrature hybrid circuits (described further below) that can be designed to provide a large bandwidth over which the power amplifier can be electronically tuned.

Figure 1:
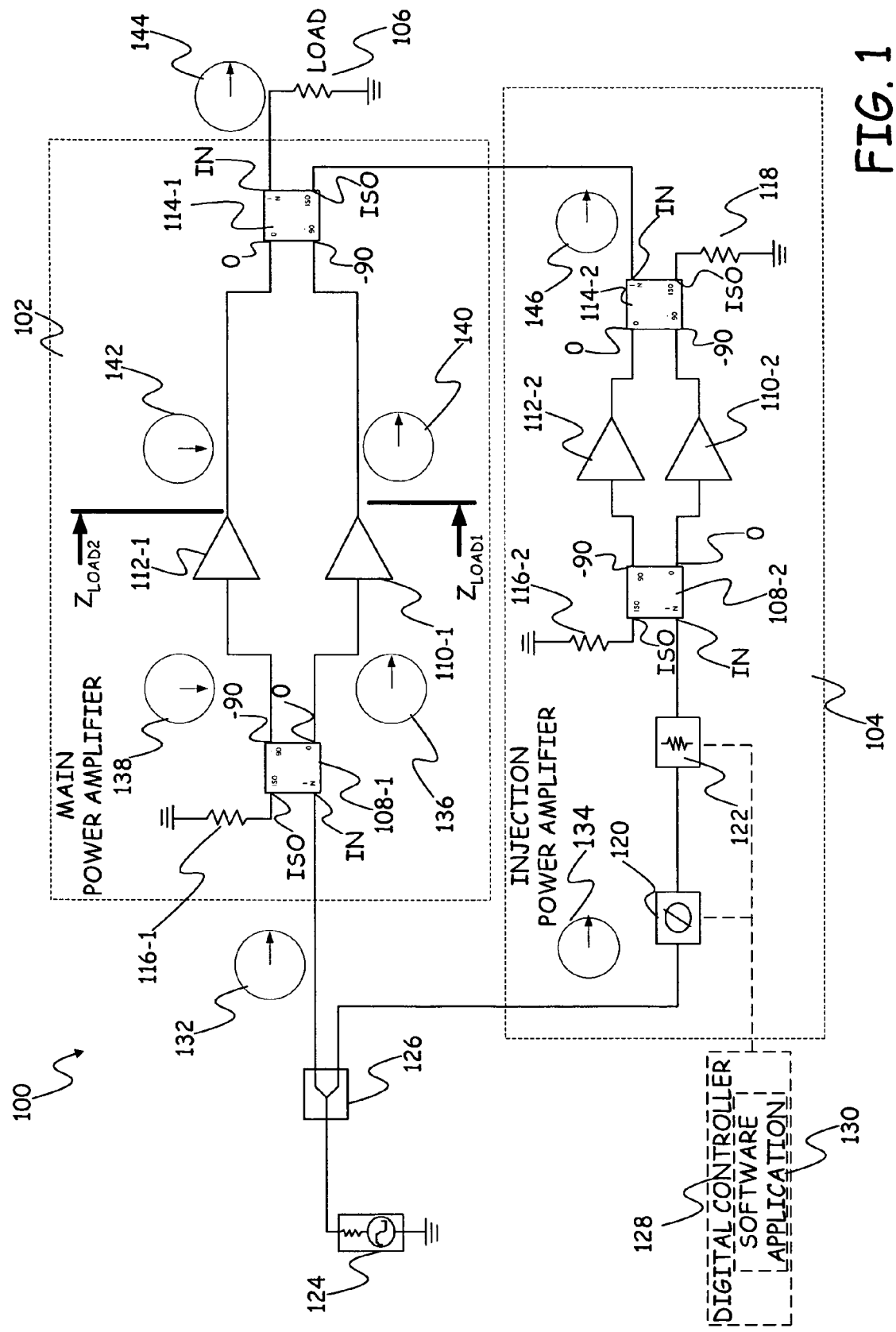
FIG. 1 is a diagrammatic illustration of a power amplifier apparatus in accordance with an embodiment of the present invention.

FIG. 1 is a diagrammatic illustration of a power amplifier apparatus 100 in accordance with an embodiment of the present invention. The primary elements of power amplifier 100 are a main power amplifier circuit 102 and an injection power amplifier circuit 104. In general, main power amplifier circuit 102 includes components that boost a low-power signal to a higher power level, to be delivered to a load (such as 106). The impedance of the main amplifier 102 is normally passively matched to the load 106. This means of matching is normally fixed. Therefore apparatus 100 employs injection amplifier 104, which can provides impedance matching to the load by introducing a phase and amplitude adjustable injection signal into main power amplifier 102.

Main power amplifier 102 includes a main power amplifier input quadrature hybrid circuit 108-1, a first large signal amplifier 110-1, a second large signal amplifier 112-1 and a main power amplifier output quadrature hybrid circuit 114-1.

As can be seen in FIG. 1, each of main power amplifier quadrature hybrid circuits 108-1 and 114-1 include an isolation port (ISO), an input port (IN), and two output ports (0 and −90). In the FIGS., these same reference characters and numbers are used to denote the four port types of the various quadrature hybrid circuits. However, this does not require that the quadrature hybrid circuits be of identical construction. In general, ports 0 and −90 output first and second versions, respectively, of a signal received at the IN port, with the first version of the signal and the second version of the signal having a phase difference of 90 degrees. Further, the ISO port and the IN port are electrically isolated and therefore cannot receive signals from each other. It should be noted that, in accordance with the present invention, a quadrature hybrid circuit (or quadrature combiner) is any circuit, combination of circuits, or component(s) that include (s) the above-noted four ports and provide the above-described general functionality.

As can be seen in FIG. 1, the IN port of main power amplifier input quadrature hybrid circuit 108-1 serves as an input for the main power amplifier. The ISO port of circuit 108-1 is connected to ground via an isolation resistor 116-1. A first of the two output ports (port 0) is coupled to an input of first large signal amplifier 110-1 and a second of the two output ports (port −90) is coupled to an input of second large signal amplifier 112-1. An output of first large signal amplifier 110-1 is connected to a second output port (port −90) of main power amplifier output quadrature hybrid circuit 114-1 and an output of second large signal amplifier 112-1 is coupled to a first output port (port 0) of circuit 114-1. The IN port of circuit 114-1 is connected to load 106 and the ISO port of circuit 114-1 is coupled to injection power amplifier circuit 104.

As mentioned above, injection power amplifier 104 is configured to provide an impedance matching load by introducing a phase and amplitude adjustable injection signal into main power amplifier 102. Other than a phase shifter circuit 120 and an attenuator circuit 122 (which are used to adjust a phase and an amplitude, respectively, of an input signal to injection power amplifier 104), the remaining components (108-2, 110-2, 112-2, 114-2 and 116-2) of circuit 104 can be in exemplary embodiments substantially similar to corresponding components (108-1, 110-1, 112-1, 114-1 and 116-1) of main power amplifier circuit 102. It should be noted that components/circuits 110-2 and 112-2 are also large signal amplifiers.

In general, in an exemplary embodiment, components (108-2, 110-2, 112-2, 114-2 and 116-2) of injection power amplifier circuit 104 are connected in a similar configuration to the earlier-described connection configuration of the components (108-1, 110-1, 112-1, 114-1 and 116-1) of main power amplifier circuit 102. However, as can be seen in FIG. 1, injection power amplifier input quadrature hybrid circuit 108-2 is not directly coupled to, or does not directly receive, an injection power amplifier input signal, but instead receives a version of the injection power amplifier input signal, which is output from attenuator 122. Further, injection power amplifier output quadrature hybrid circuit 114-2 has its ISO port connected to ground, via isolation resistor 118, and its IN port connected to the ISO port of main power amplifier output quadrature hybrid circuit 114-1. In embodiments of the present invention, phase shifter circuit 120 and attenuator circuit 122 are software controlled (using a digital controller 128, for example, that includes a suitable software application 130 for carrying out the necessary phase and/or amplitude control). While in exemplary embodiments circuits 102 and 104 can have substantially similar components and circuit configurations, this need not be the case in all embodiments. For example, other configurations of circuit 104 can be used to generate the injection signal to control impedance seen by amplifiers 110-1 and 112-1 of circuit 102.

Also included in (or used in conjunction with) apparatus 100, and shown in FIG. 1, are a source 124, which can provide a suitable source signal of a desired frequency (high frequency (HF), very high frequency (VHF), ultra high frequency (UHF), etc.), and a splitter circuit 126, which is configured to receive the source signal and responsively output a main power amplifier input signal and an injection power amplifier input signal. It should be noted that, in FIG. 1, circled arrows 132, 134, 136, 138, 140, 142, 144 and 146 specifically represent phases of different signals output by different components of circuit 100, but in the following description of the operation of circuit 100, for simplification, they are used to generally represent the respective component input/output signals.

In operation, a signal from source 124 is split, by splitter circuit 126, into a main power amplifier input signal 132 and an injection power amplifier input signal 134. Signals 132 and 134 are typically in phase with each other. Main power amplifier input quadrature hybrid circuit 108-1 receives main power amplifier input signal 132 at its IN port and responsively provides, for amplification, a first version 136 of main power amplifier input signal 132 to first large signal amplifier 110-1 and a second version 138 of main power amplifier input signal 132 to second large signal amplifier 112-1. As indicated in FIG. 1, first version 136 and second version 138, of main power amplifier input signal 132, have a phase difference of substantially 90 degrees. Amplified versions 140 and 142, of signals 136 and 138 are output from amplifiers 110-1 and 112-1 and fed to main power amplifier output quadrature hybrid circuit 114-1, which, in turn, provides, via its IN port, a main power amplifier output signal 144 to load 106.

The injected signal is split by quadrature hybrid 114-1 creating waves traveling toward the output ports of amplifiers 112-1 and 110-1. Signals traveling toward the amplifiers combined with signals generated by the amplifiers to produce the presented impedances $Z_{LOAD1}$ and $Z_{LOAD2}$ at the output reference planes of amplifiers 110-1 and 112-1. The phase relationship between the forward waves and the injected waves is such that the impedances $Z_{LOAD1}$ and $Z_{LOAD2}$ are equal.

Figure 2:
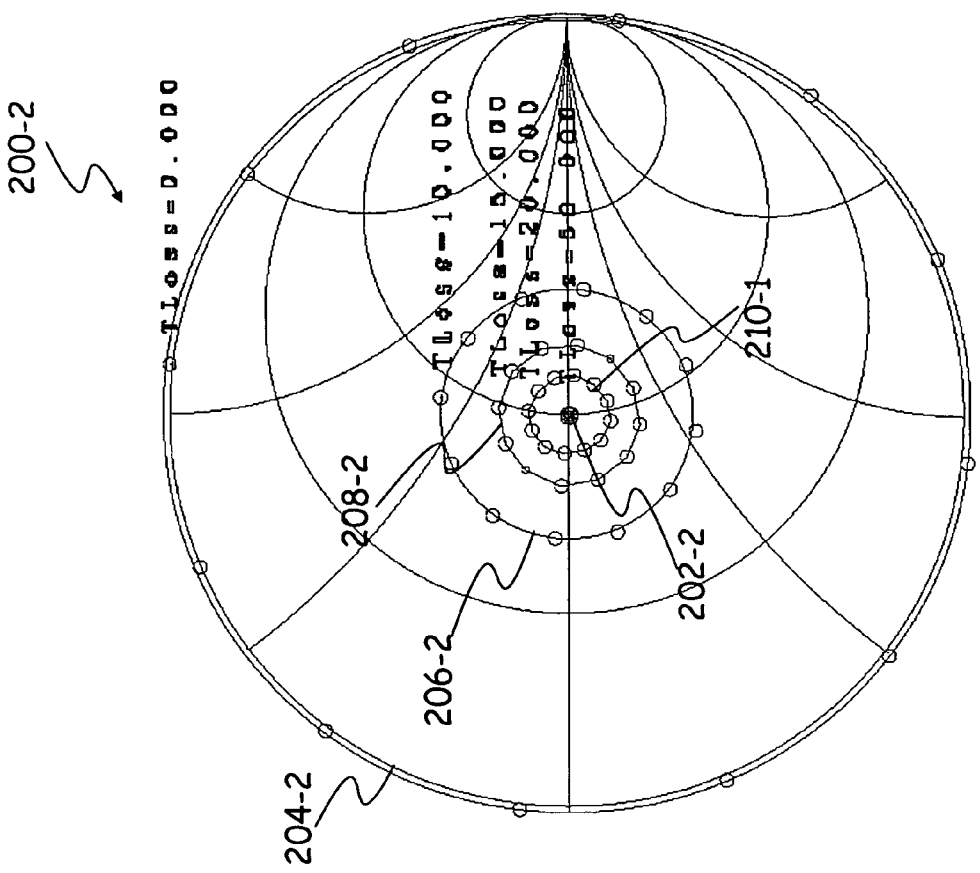
FIG. 2 is a plot illustrating the impedances presented to the individual amplifiers within the main amplifier by adjusting the phase and amplitude of the injected signal using the apparatus of FIG. 1.
Figure 2:
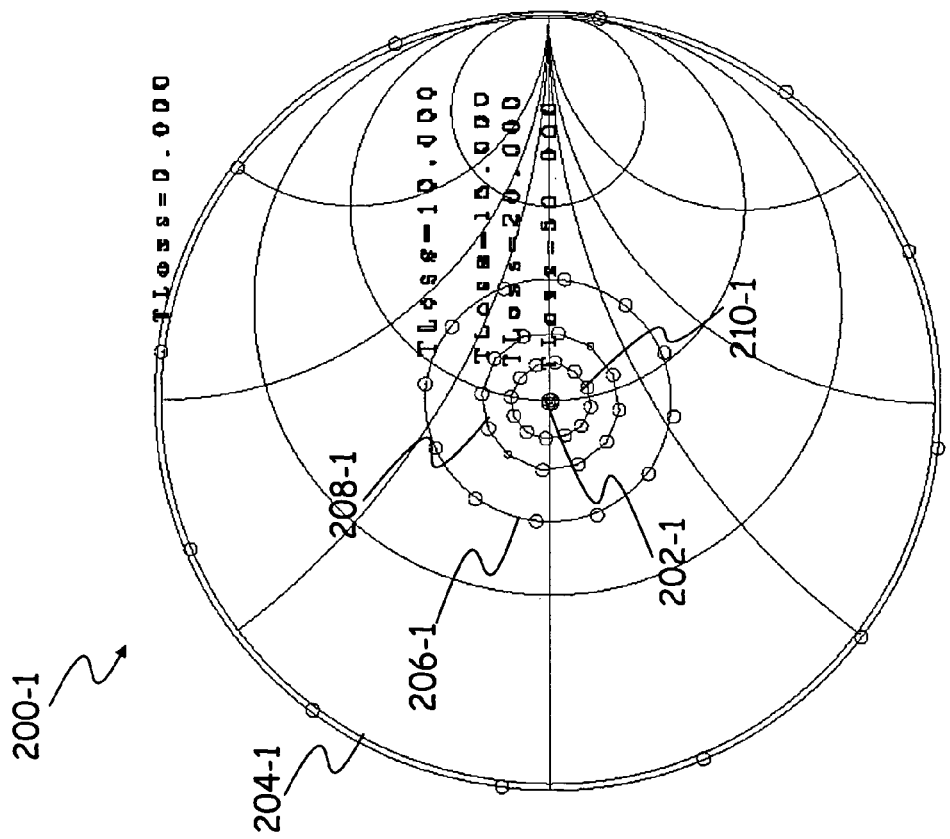

FIG. 2 is a Smith's Chart that includes plots illustrating a range of injection signal amplitude and phase adjustments that can be carried out in power amplifier apparatus 100 of FIG. 1 to vary the impedance seen by amplifiers 110-1 and 112-1. In FIG. 2, Smith's Chart plots 200-1 represent possible impedance matches for amplifier 110-1 ($Z_{LOAD1}$ (FIG. 1)) and Smith's Chart plots 200-2 represent impedance matching for amplifier 112-1 ($Z_{LOAD2}$ (FIG. 1)). In general, if no injection signal is present, there is an initial match between impedances $Z_{LOAD1}$ and $Z_{LOAD2}$ and load 106. In this case, the attenuator circuit 122 is adjusted such that injection power amplifier input signal 134 is attenuated completely, resulting in no injection signal 146 being provided to main power amplifier circuit 102. Under a 50 ohm resistance standard or resistance plane, a setting of attenuator 122, which results in no injection signal 146 being output, is represented by 50 ohm points 202-1 and 202-2 in FIG. 2. Circles 204-1 and 204-2 represent an opposite condition in which impedances $Z_{LOAD1}$ and $Z_{LOAD2}$ and load 106 are adjusted using the injected signal to be substantially different from the load 106. In this case, the injection power amplifier input signal is adjusted to produce injection signal 146 which creates waves traveling toward the amplifiers which are equal in magnitude to the waves traveling away from the main amplifiers. Concentric circles 206-1 and 206-2, 208-1 and 208-2, and 210-1 and 210-2 represent different signal attenuation levels that lie between the two opposite scenarios discussed above. Different points on each of circles 204 through 208 represent different phases (0 to 360 degrees) that can be obtained through phase adjustments carried out with the help of phase shifter circuit 120.

Figure 3:
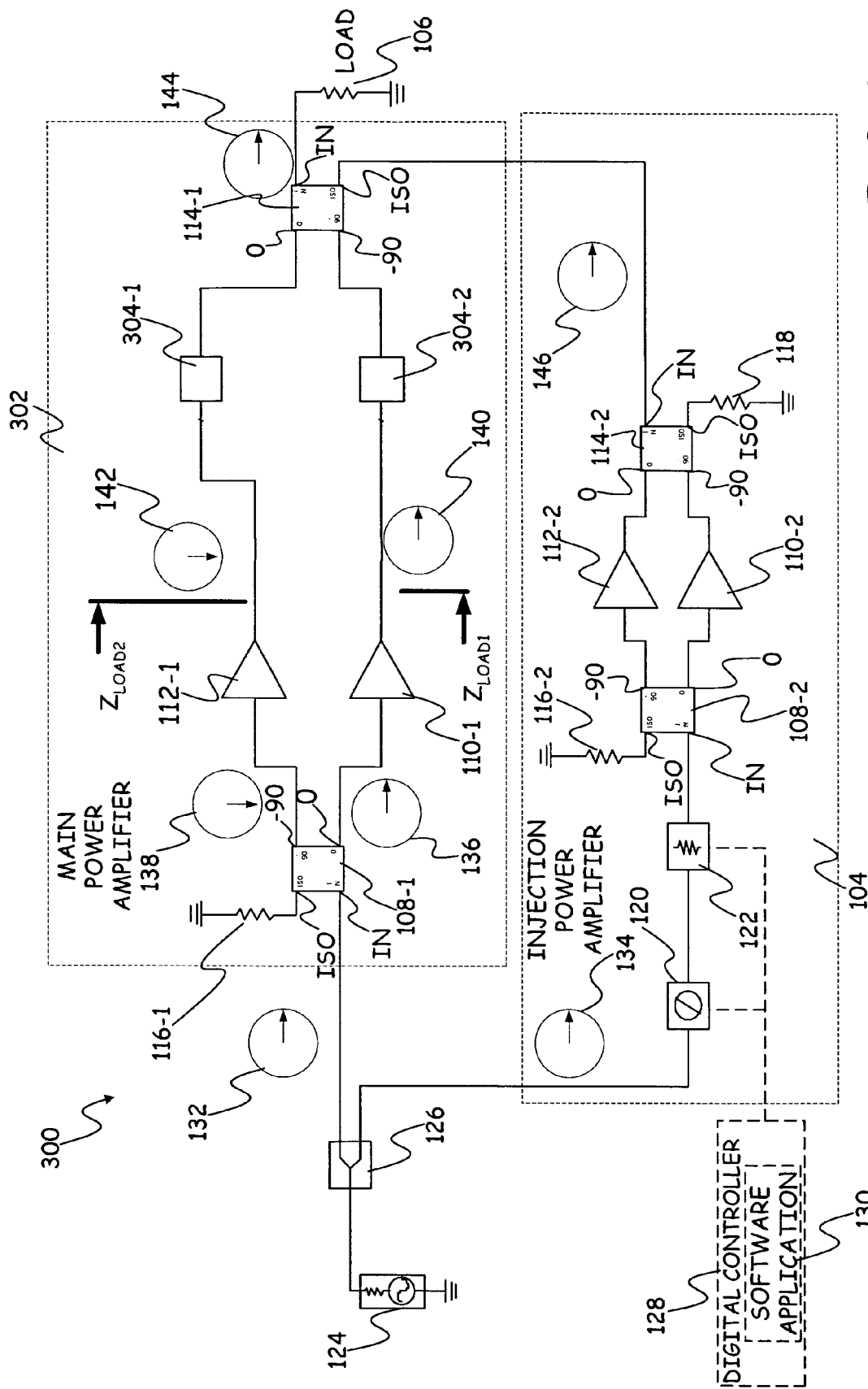
FIG. 3 is a diagrammatic illustration of a power amplifier apparatus in accordance with another embodiment of the present invention.
Figure 4:
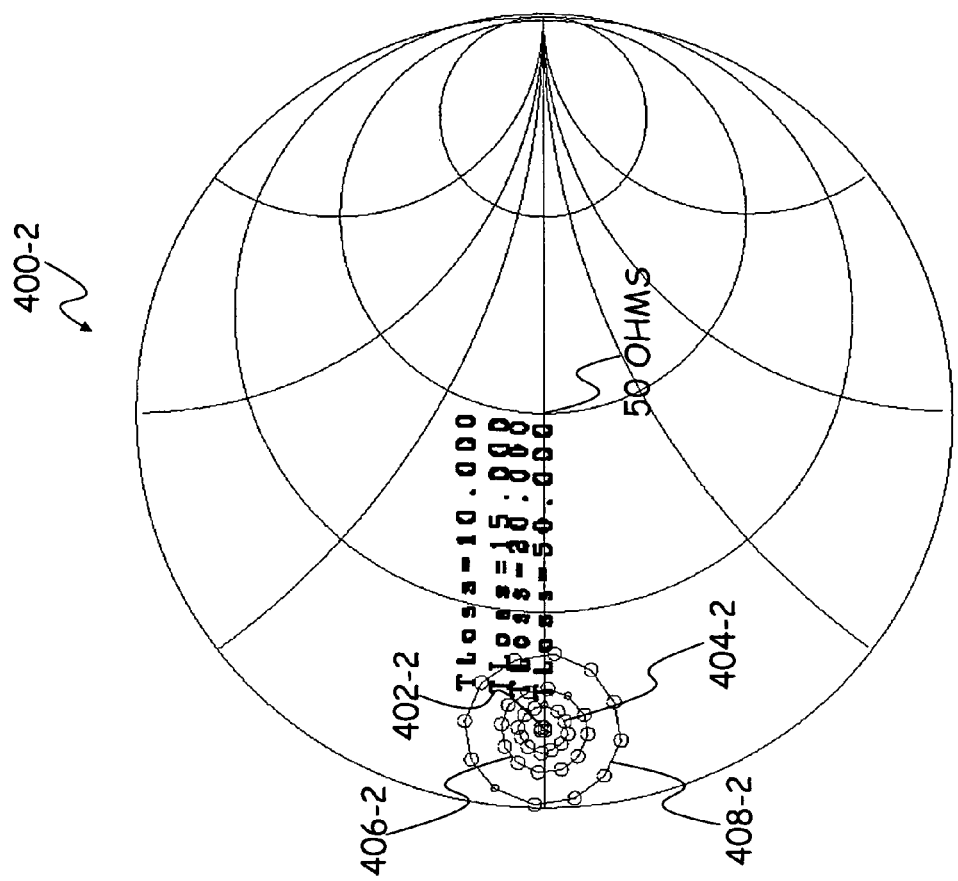
FIG. 4 is a plot illustrating the impedances presented to the individual amplifiers within the main amplifier by adjusting the phase and amplitude of the injected signal using the apparatus of FIG. 3.
Figure 4:
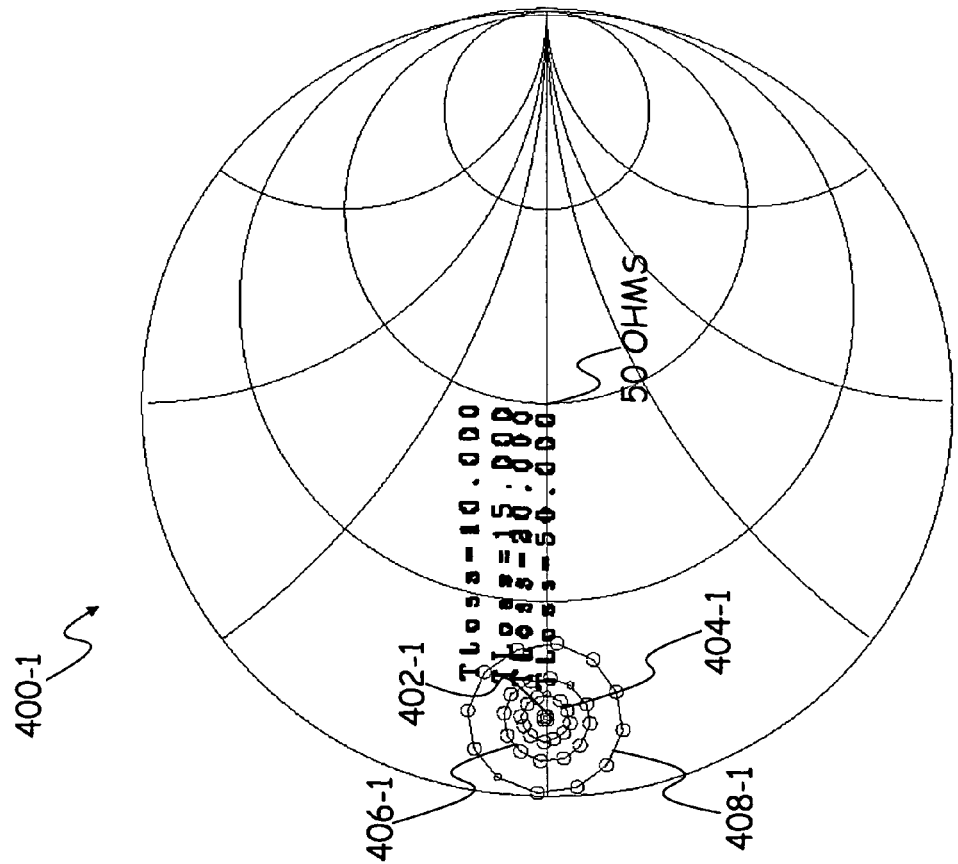

FIG. 3 is a diagrammatic illustration of a power amplifier apparatus 300 in accordance with another embodiment of the present invention. Other than including additional impedance transformers 304-1 and 304-2 in main power amplifier circuit 300, the remaining components of power amplifier apparatus 300 are substantially similar to, and are connected together in a manner similar to, the components of power amplifier apparatus 100 (FIG. 1). As can be seen in FIG. 3, impedance transformers 304-1 and 304-2, which are typically substantially similar to each other, are connected between amplifiers 110-1 and 112-1 and the respective ports of main power amplifier output quadrature hybrid circuit 114-1. The introduction of impedance transformers 304-1 and 304-2 altars $Z_{LOAD1}$ and $Z_{LOAD2}$ based on impedance ratios of the transformers. For example, if each of transformers 304-1 and 304-2 has an impedance ratio of 9:1, the 50 ohm reference plane is altered to a 5.56 (50/9) ohm reference plane. Amplitude and phase adjustment ranges for a 5.56 ohm reference plane power amplifier apparatus are shown in Smith's Cart plots 400-1 ($Z_{LOAD1}$ (FIG. 3)) and 400-2 ($Z_{LOAD2}$ (FIG. 3)). As can be seen in FIG. 4, when no injection signal is applied, 5.56 ohm points 402-1 and 402-2 represent complete attenuation of injection power amplifier input signal 134. Concentric circles 404-1 and 404-2, 406-1 and 406-2, and 408-1 and 408-2, with 5.56 ohm points 402-1 and 402-2 as their respective centers, represent different signal attenuation levels when injection signals are required.

Although the present invention has been described with reference to preferred embodiments, workers skilled in the art will recognize that changes may be made in form and detail without departing from the spirit and scope of the invention.

What is claimed is:

1. An electronically tuned power amplifier apparatus comprising:
   a main power amplifier circuit comprising:
      a first large signal amplifier;
      a second large signal amplifier; and
      a main power amplifier output quadrature hybrid circuit having an isolation port, an input port, and two output ports, wherein a first of the two output ports of the main power amplifier output quadrature hybrid circuit is coupled to an output of the first large signal amplifier of the main power amplifier circuit, and a second of the two output ports of the main power amplifier output quadrature hybrid circuit is coupled to an output of the second large signal amplifier of the main power amplifier circuit; and
   an injection power amplifier circuit configured to provide an injection signal into the isolation port of the main power amplifier output quadrature hybrid circuit, wherein the injection signal controls impedance seen by the first and second large signal amplifiers of the main power amplifier circuit.

2. The power amplifier apparatus of claim 1 wherein the main power amplifier circuit further comprises a main power amplifier input quadrature hybrid circuit having an isolation port, an input port, and two output ports, wherein a first of the two output ports of the main power amplifier input quadrature hybrid circuit is coupled to an input of the first large signal amplifier of the main power amplifier circuit, and wherein a second of the two output ports of the main power amplifier input quadrature hybrid circuit is coupled to an input of the second large signal amplifier of the main power amplifier circuit.

3. The power amplifier apparatus of claim 2 wherein the main power amplifier input quadrature hybrid circuit is configured to receive a main power amplifier input signal at its input port and responsively provide a first version the main power amplifier input signal to the input of the first large signal amplifier of the main power amplifier circuit, and a second version of the main power amplifier input signal to the input of the second large signal amplifier of the main power amplifier circuit, and wherein the first version of the main power amplifier input signal and the second version of the main power amplifier input signal have a phase difference of substantially 90 degrees.

4. The power amplifier apparatus of claim 3 wherein the main power amplifier input signal is one of two signals output by a splitter circuit, which is configured to receive a source signal and responsively provide the main power amplifier input signal and an injection power amplifier input signal.

5. The power amplifier apparatus of claim 4 wherein the injection power amplifier circuit comprises a phase shifter circuit that is configured to adjust a phase of the injection power amplifier input signal.

6. The power amplifier apparatus of claim 5 wherein the injection power amplifier circuit further comprises an attenuator circuit that is configured to adjust the amplitude of the injection power amplifier input signal.

7. The power amplifier apparatus of claim 6 wherein at least one of the phase shifter circuit and the attenuator circuit are software controlled to control the injection signal and thereby control impedance seen by the first and second large signal amplifiers of the main power amplifier circuit.

8. The power amplifier apparatus of claim 6 wherein the injection power amplifier circuit further comprises an injection power amplifier input quadrature hybrid circuit having an isolation port, an input port, and two output ports, wherein the input port of the injection power amplifier input quadrature hybrid circuit is coupled to an output of the attenuator circuit.

9. The power amplifier apparatus of claim 8 wherein the injection power amplifier input quadrature hybrid circuit is configured to receive the injection power amplifier input signal, via the phase shifter circuit and the attenuator circuit, at its input port and responsively provide a first version the injection power amplifier input signal at a first of its two output ports and a second version of the injection power amplifier input signal at a second of its two output ports, and wherein the first version of the injection power amplifier input signal and the second version of the injection power amplifier input signal have a phase difference of substantially 90 degrees.

10. The power amplifier apparatus of claim 9 wherein the injection power amplifier input signal received at the input port of the injection power amplifier input quadrature hybrid circuit is a version of the injection power amplifier input signal that has been phase shifted and attenuated.

11. The power amplifier apparatus of claim 9 wherein the injection power amplifier circuit further comprises a first large signal amplifier and a second large signal amplifier, the first large signal amplifier of the injection power amplifier circuit configured to receive and responsively amplify the first version the injection power amplifier input signal, and the second large signal amplifier of the injection power amplifier circuit configured to receive and responsively amplify the second version the injection power amplifier input signal.

12. The power amplifier apparatus of claim 11 wherein the injection power amplifier circuit further comprises an injection power amplifier output quadrature hybrid circuit having an isolation port, an input port, and two output ports, wherein a first of the two output ports of the injection power amplifier output quadrature hybrid circuit is coupled to an output of the first large signal amplifier of the injection power amplifier circuit, wherein a second of the two output ports of the injection power amplifier output quadrature hybrid circuit is coupled to an output of the second large signal amplifier of the injection power amplifier circuit, and wherein the input port of the injection power amplifier output quadrature hybrid circuit is coupled to the isolation port of the main power amplifier output quadrature hybrid circuit to thereby provide the injection signal.

13. A method of tuning a main power amplifier having a first large signal amplifier, a second large signal amplifier, and a main power amplifier output quadrature hybrid circuit having an isolation port, an input port, and two output ports, the first of the two output ports being coupled to an output of the first large signal amplifier and a second of the two output ports being coupled to an output of the second large signal amplifier, the method comprising:
   injecting an impedance tuning signal into the isolation port of the main power amplifier output quadrature hybrid circuit to control impedance seen by the first and second large signal amplifiers.

14. The method of claim 13 wherein injecting the impedance tuning signal into the isolation port of the main power amplifier output quadrature hybrid circuit further comprises injecting the impedance tuning signal into the isolation port of the main power amplifier output quadrature hybrid circuit from an injection power amplifier circuit.

15. The method of claim 14 and further comprising controlling the impedance tuning signal by controlling a phase of an input signal provided to the injection power amplifier circuit.

16. The method of claim 15 and further comprising controlling the impedance tuning signal by controlling an attenuation of the input signal provided to the injection power amplifier circuit.

17. The method of claim 16 wherein at least one of controlling the attenuation and controlling the phase, of the input signal provided to the injection power amplifier circuit, is carried out using a software application.

18. The method of claim 16 wherein injecting the impedance tuning signal into the isolation port of the main power amplifier output quadrature hybrid circuit from an injection power amplifier circuit further comprises injecting the impedance tuning signal into the isolation port of the main power amplifier output quadrature hybrid circuit from an input port of an injection power amplifier output quadrature hybrid circuit.

19. The method of claim 18 wherein the impedance tuning signal is provided as a function of an amplified first version, of the input signal provided to the injection power amplifier circuit, and an amplified second version of the input signal provided to the injection power amplifier circuit.

20. An electronically tuned power amplifier apparatus comprising:
    a main power amplifier having a pair of quadrature coupled amplifiers;
    an injection power amplifier having a pair of quadrature coupled amplifiers, wherein an output of the injection power amplifier is coupled to an isolation port of a quadrature combiner of the main power amplifier; and
    a signal splitter circuit;
    wherein the signal splitter circuit is configured to receive an input signal and responsively apply a main power amplifier input signal to the main power amplifier and an injection power amplifier input signal to the injection power amplifier, and wherein the injection power amplifier is configured to adjust a magnitude and a phase of the injection power amplifier input signal to output a suitable injection signal to the isolation port of the quadrature combiner of the main power amplifier to thereby control impedance seen by the pair of quadrature coupled amplifiers of the main power amplifier.

* * * * *